US008591715B2

(12) United States Patent
Zahraoui et al.

(10) Patent No.: US 8,591,715 B2
(45) Date of Patent: Nov. 26, 2013

(54) ELECTRODEPOSITION COMPOSITION AND METHOD FOR COATING A SEMICONDUCTOR SUBSTRATE USING THE SAID COMPOSITION

(75) Inventors: Saïd Zahraoui, Savigny sur Orge (FR); Frédéric Raynal, Paris (FR)

(73) Assignee: Alchimer, Massy (FR)

( * ) Notice: Subject to any disclaimer, the term of this patent is extended or adjusted under 35 U.S.C. 154(b) by 549 days.

(21) Appl. No.: 12/435,031

(22) Filed: May 4, 2009

(65) Prior Publication Data

US 2009/0294293 A1 Dec. 3, 2009

Related U.S. Application Data

(60) Provisional application No. 61/194,977, filed on Oct. 2, 2008.

(30) Foreign Application Priority Data

May 5, 2008 (FR) ..................... 08 52970

(51) Int. Cl.
*C25D 3/38* (2006.01)
*C25D 5/02* (2006.01)
*C25D 7/12* (2006.01)
*H01L 21/288* (2006.01)

(52) U.S. Cl.
USPC ........... 205/123; 205/118; 205/157; 205/125; 205/296

(58) Field of Classification Search
USPC .................. 205/157, 291, 118, 123, 125, 296
See application file for complete search history.

(56) References Cited

U.S. PATENT DOCUMENTS 6,197,181 B1 3/2001 Chen
7,060,624 B2 6/2006 Andricacos et al.
(Continued)

FOREIGN PATENT DOCUMENTS

| EP | 1 479 793 A2 | 11/2004 |
|---|---|---|
| WO | WO 2007/034116 A2 | 3/2007 |
| WO | WO 2007/034117 A2 | 3/2007 |
| WO | WO 2007/096390 A1 | 8/2007 |

OTHER PUBLICATIONS

Kim et al. ("Factors Affecting Copper Filling Process within High Aspect Ratio Deep Vias for 3-D Chip Stacking," 2006, IEEE, pp. 838-843).*

(Continued)

*Primary Examiner* — Edna Wong
(74) *Attorney, Agent, or Firm* — Hamre, Schumann, Mueller & Larson, P.C.

(57) ABSTRACT

The present invention relates to an electrodeposition composition intended particularly for coating a semiconductor substrate in order to fabricate structures of the "through via" type for the production of interconnects in integrated circuits. According to the invention, the said solution comprises copper ions in a concentration of between 14 and 120 mM and ethylenediamine, the molar ratio between ethylenediamine and copper being between 1.80 and 2.03 and the pH of the electrodeposition solution being between 6.6 and 7.5. The present invention also relates to the use of the said electrodeposition solution for the deposition of a copper seed layer, and to the method for depositing a copper a seed layer with the aid of the electrodeposition solution according to the invention.

9 Claims, 2 Drawing Sheets

(56) References Cited

U.S. PATENT DOCUMENTS

| | | |
|---|---|---|
| 7,101,792 B2 | 9/2006 | Kirby et al. |
| 7,148,565 B2 | 12/2006 | Kim et al. |
| 2003/0155247 A1* | 8/2003 | Miura et al. ............ 205/157 |
| 2004/0022940 A1* | 2/2004 | Nagai et al. ............ 427/230 |
| 2007/0045858 A1 | 3/2007 | Kirby et al. |
| 2007/0062817 A1* | 3/2007 | Monchoix et al. ............ 205/291 |
| 2007/0068820 A1 | 3/2007 | Baskaran et al. |
| 2007/0272560 A1* | 11/2007 | Gonzalez et al. ............ 205/296 |

OTHER PUBLICATIONS

Topol, A. W. et al. "Three-dimensional integrated circuits", IBM J. Res & Dev., vol. 50, No. 4/5, Jul./Sep. 2006, pp. 491-506.

Lide, David R., editor, "Handbook of Chemistry and Physics" $84^{th}$ edition, CRC Press, p. 8-44-8-45.

* cited by examiner

ELECTRODEPOSITION COMPOSITION AND METHOD FOR COATING A SEMICONDUCTOR SUBSTRATE USING THE SAID COMPOSITION

FIELD

This disclosure relates in general to an electrodeposition composition intended for coating a surface of a substrate with copper, particularly a surface consisting of an electrically resistive material, and in particular for coating a barrier layer against copper diffusion.

The disclosure herein may essentially be employed in the field of microelectronics for the metallization of through vias ("through silicon vias" or "through wafer vias" or "through wafer interconnects"), which are the cornerstone of the integration of electronic "chips" (or "dice") in three dimensions (3D) or vertical integration. It may also be employed in other fields of electronics where a substrate having through vias and a layer forming a barrier against copper diffusion needs to be covered with a layer of copper. Examples which may be mentioned in this context are the fabrication of interconnection elements in printed circuits ("printed circuit boards" or "printed wire boards") or that of passive elements such as inductors, or electromechanical elements in integrated circuits or microsystems ("micro-electromechanical systems").

BACKGROUND

Contemporary electronic systems are mostly composed of a plurality of integrated circuits, and each integrated circuit fulfills one or more functions. For example, a computer has at least one microprocessor and a plurality of memory circuits. Each integrated circuit usually corresponds to an electronic chip in its own "package". The integrated circuits are soldered or inserted onto, for example, a "printed circuit board" (or "PCB") which provides the connection between the integrated circuits.

For the last several generations of integrated circuits, the constant need to increase the density of functionality has led to systems being designed according to the "system on chip" concept. All the components and circuit blocks necessary for implementing the set of functions of the system are then produced on the same chip, without using the support of a printed circuit. In practice, it is however very difficult to obtain a high-performance "system on chip" because the methods of fabricating logic and memory circuits, for example, differ very substantially.

The "system on chip" approach therefore entails accepting a compromise between the performances of the various functions produced on the same chip. Furthermore, the size of such chips and their fabrication yield are reaching the limits of their economic viability.

Another approach consists in fabricating, in the same package, a module that provides the interconnection of a plurality of integrated circuits, which may in this case belong to the same semiconductor substrate or different substrates. The package thus obtained, a "multi-chip module" (or "MCM"), is thus in the form of a single component. There are various technologies for an "MCM" substrate, for example laminated, ceramic. In all cases, the "MCM" approach makes it possible to obtain a higher interconnection density and therefore better performance than a classical "PCB" approach. It is not, however, fundamentally different therefrom. Further to the bulk and weight of the package, the performances of an "MCM" remain limited by the parasitic elements associated with the length of the connections of the substrate and with the connection wires ("wire bonding") joining the substrate or the chips to the "pins" of the package.

By virtue of using integration in three dimensions (3D) or vertical integration, the chips are "stacked" and are connected together by vertical interconnects. The stack obtained has a plurality of layers or strata of active components or chips, and it constitutes an integrated circuit in three dimensions ("3D integrated circuit" or "3D IC").

The benefits of 3D integration relate simultaneously to:

(1) the improvement in performance, for example reduction of the propagation time and the power dissipated, increase in the operating speed of the system associated with accelerated communication between the functional blocks, increase in the passband of each functional block, increase in the noise immunity, (2) the cost improvement, for example increase in the integration density, better fabrication yield owing to use of the electronic chip generation most appropriate for each functional block, increase in reliability, and (3) the possibility of producing large-scale integrated systems by stacking heterogeneous technologies (or co-integration) i.e. employing different materials and/or different functional components.

Today, 3D integration proves to be an indispensable alternative to conventional approaches, which are reaching their limits in terms of performance, functionality diversification and production cost. After stacking, for example by adhesive bonding, the chips can be connected individually to the pins of the package by connection wires. However, mutual interconnection of the chips with a high interconnect density can be obtained only by employing through vias. The fundamentals and advantages of 3D integration have been described for example in: A. W. Topol, D. C. La Tulipe, L. Shi, D. J. Frank, K. Bernstein, S. E. Steen, A. Kumar, G. U. Singco, A. M. Young, K. W. Guarini and M. Leong, "Three-dimensional integrated circuits" IBM Journal Res. & Dev., vol. 50, No 4/5, July/September 2006, pages 491-506.

The thinning of the silicon "wafers", the alignment between the layers, the "bonding" of the layers, the etching and the metallization of the through vias within each layer are elementary technologies necessary for the production of three-dimensional integrated circuits.

Three-dimensional integrated circuits can be produced by thinning the silicon wafer before fabricating the through vias (for example U.S. Pat. Nos. 7,060,624; 7,148,565).

The etching and metallization of the vias may also be carried out before thinning the silicon wafer (for example U.S. Pat. Nos. 7,060,624; 7,101,792). In this case the vias are etched into the silicon, then metallized to the desired depth before thinning the silicon wafer. During their metallization, the vias are therefore closed, or "blind vias".

The good electrical conductivity of copper and its high resistance to the phenomenon of electromigration, that is to say little migration of copper atoms under the effect of the electrical current density, which is liable to be a major cause of a malfunction, make it in particular a material of choice for metallization of the through vias.

The through vias are generally produced in a similar way to the "Damascene process" (used in the field of microelectronics to fabricate elements for interconnecting integrated circuits) according to a succession of steps involving:

etching the vias into or through the silicon wafer;

depositing a layer of insulating dielectric (generally consisting of silicon oxide or nitride, for example);

depositing a barrier layer or "liner" (generally consisting of tantalum (Ta), titanium (Ti), tantalum nitride (TaN), titanium nitride (TiN), tungsten titanate (TiW) and tungsten nitride or carbide (WCN) or combinations of these metals, for example) which is used to prevent the migration of copper;

depositing a thin layer of metallic copper, referred to as a "seed layer";

filling the vias by electrodeposition of copper; and removing the excess copper by chemical-mechanical polishing.

The steps of depositing the barrier layer, the seed layer, and filling and polishing the copper create the metallization of the through vias.

The barrier layer generally has too high a resistance to allow copper to be deposited homogeneously or uniformly on the wafer scale by direct electrochemical means, a phenomenon known to the person skilled in the art by the term ohmic drop. The high resistance of the barrier layer results from the high resistivity of the metals constituting it (for example metal nitrides).

Before the step of filling by electrodeposition of copper, it is therefore necessary to cover the barrier layer—by a non-electrochemical method—with a thin layer of metallic copper referred to as the seed layer.

This seed layer, like the barrier layer, is currently produced by "physical vapour deposition" or "chemical vapour deposition" processes (PVD and CVD).

Chemical vapour deposition (CVD) makes it possible to obtain a conformal layer of copper, that is to say one which accurately follows the topology of the surface to be coated, and does so for a wide range of form factors ("aspect ratios").

SUMMARY

Copper layers formed by chemical vapour deposition adhere poorly to the diffusion barriers. In practice, this limits the advantage of this type of method in so far as strong adhesion between the copper and the barrier is required in order to ensure reliability of the through vias.

Furthermore, methods using chemical vapour deposition are relatively expensive because of the high cost of the consumables (precursors), the equipment necessary for implementing them and their low yield.

Physical vapour deposition (PVD) is currently preferred from an industrial viewpoint, in so far as it makes it possible to coat surfaces having a high resistivity with much better adhesion of copper on the barrier than is obtained with methods of the CVD type.

The thickness of the coating deposited by PVD is directly proportional to the solid angle seen from the surface to be coated. For this reason, the parts of the surface which have projecting angles are covered with a thicker layer than the parts of the surface which have re-entrant angles. The result of this is that the copper seed layers formed by physical vapour deposition are not conformal, and they do not therefore have a uniform thickness at every point on the surface of the substrate.

In particular, high-density three-dimensional integrated circuits require the use of anisotropic silicon etching methods in order to obtain vias with a vertical profile. The anisotropic etching of silicon (for example U.S. Pat. No. 5,501,893) leads most often to a profile which is barrel-shaped ("bowing"), rough, fluted or striated ("scalloping"). Thus, the sides of the layers may be partially uncovered or covered with an insufficient thickness of seed layer, then causing imperfect subsequent filling with material defects ("voids"). Furthermore, the seed layer formed on the sides of the patterns inherently has different adhesion from that deposited on the plane surface of the substrate. This may lead to reduced reliability performance. In other words, the conformity defect is not only revealed by differences in thickness; it may also lead to defects of continuity and adhesion of the layers on the sides of the vias.

These drawbacks make it very difficult to use PVD technology for metallizing the through vias of high-density three-dimensional integrated circuits, in which the form factors may be very high.

In this context, there is a pressing requirement to provide an alternative to the methods of chemical or physical vapour deposition. The metal electrodeposition techniques traditionally used do not make it possible to meet this requirement satisfactorily, in so far as they cannot be employed on resistive substrates and they are therefore unsuitable for the production of copper seed layers.

In fact, traditional copper electrodeposition has to date been used principally to fill the through vias by applying a current to a wafer previously covered with a seed layer and immersed in an acidic bath of copper sulfate containing additives (for example U.S. Pat. No. 7,060,624).

Copper electrodeposition has also been advocated, particularly by Patent Application US2007/0045858A1, for filling any possible gaps in the seed layer of structures of the "through via" type or in order to repair this layer ("seed repair" or "seed enhancement").

In a preferred embodiment described in this prior document, a nonuniform seed layer of copper (thickness of the order of 200 nanometres) is produced in a first step, then the conformity or uniformity of the layer is improved in a second step by a method of repairing the said layer.

Furthermore, from Document WO 2007/034116, electrodeposition compositions are known which make it possible to deposit copper seed layers which adhere and are conformal and uniform, directly on resistive barriers. Although no precise specifications seem to have been established concerning the minimum thickness which the copper seed layers for through vias should have, common practice is nevertheless to produce copper deposits at least of the order of a few hundreds of nanometres, particularly in order to achieve a continuous and conformal copper layer on the irregular profiles due to scalloping of the sides of vias. However, the formulations described in Document WO 2007/034116 are designed for the production of ultrathin deposits, usually with a thickness of less than 20 nm, on substrates having resistivities of the order of a few tens of ohms/square. Moreover, it has been found that such formulations do not make it possible to achieve the larger thicknesses necessary for through vias, at least with deposition times compatible with industrial application.

Lastly, from Document WO 2007/096390, electrodeposition compositions are known which make it possible to fill interconnect lines and holes with copper in one and the same step in the fabrication of semiconductor elements. Although the formulations described in this prior art document make it possible to produce a relatively thick layer of copper, they are specifically designed to resolve problem of filling interconnect lines and holes of small volume, in which the question of the conformity of the coating does not apply. It has been found that the compositions illustrated by the examples mentioned in Document WO 2007/096390 cannot be used for the production of conformal copper seed layers on through vias, in so far as they lead to substrate coverage factors which are insufficient in terms of current industrial necessities.

Under these conditions, it is an object of the present invention to resolve the new technical problem consisting in providing a new composition which is intended for the metallization of through vias, particularly of three-dimensional integrated circuits, which makes it possible to produce continuous and conformal copper seed layers by electrodeposition for a wide range of form factors and which adheres excellently on diffusion barrier surfaces which may have a high resistivity.

It has been discovered, and this forms the basis of the present invention, that it is possible to resolve the aforementioned technical problem with the aid of very specific electrodeposition compositions based on a precisely selected mixture of copper and ethylenediamine.

DETAILED DESCRIPTION

Figure 1:
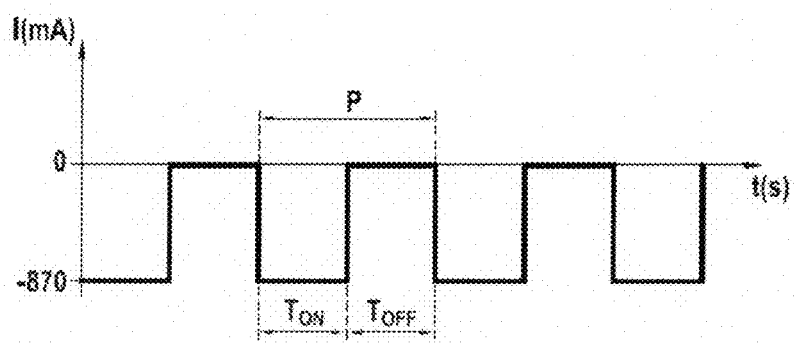
FIG. 1 illustrates the galvano-pulsed protocol used for the formation of a copper coating in an electro-deposition method according to the invention.

According to a first aspect, embodiments are related to an electrodeposition composition intended particularly for coating a semiconductor substrate in order to fabricate structures of the "through via" type for the production of interconnects in integrated circuits, characterized in that it comprises, in solution in a solvent:
  copper ions in a concentration of between 14 and 120 mM;
  ethylenediamine;
  the molar ratio between ethylenediamine and copper being between 1.80 and 2.03;
  the pH of the said composition being between 6.6 and 7.5

Here, electrodeposition is intended to mean a method which makes it possible to cover a surface of a substrate with a metallic or organometallic coating, in which the substrate is electrically polarized and brought in contact with a liquid containing precursors of the said metallic or organometallic coating, so as to form the said coating. When the substrate is electrically conductive, the electrodeposition is carried out for example by passing a current between the substrate to be coated, constituting one electrode (the cathode in the case of a metallic or organometallic coating), and a second electrode (the anode) in a bath containing a source of precursors of the coating material (for example metal ions in the case of a metallic coating) and optionally various agents intended to improve the properties of the coating being formed (regularity and fineness of the deposit, resistivity, etc.), optionally in the presence of a reference electrode.

By convention, when considering electrolysis cells, the current is denoted with a negative sign when it flows to the cathode of the electrochemical circuit (cathodic current) and it is denoted with a positive sign when it flows to the anode of the electrochemical circuit (anodic current).

The electrodeposition compositions according to the invention may be employed for any sequence of producing three-dimensional circuits (metallization before or after the step of thinning the silicon wafer).

It has been shown that these compositions quite surprisingly make it possible to obtain a copper seed layer leading to a particularly high substrate coverage factor (more than 99%) including in the most critical zones, and even when the structure has a high form factor (aspect ratio of more than 3:1, even of the order of 10 to 15:1) and a relatively large via volume (from $0.8 \cdot 10^1$ to $5.10^6$ μm$^3$). These compositions are therefore perfectly compatible with use on the industrial scale.

A preferred family of compositions comprises those whose copper ions are present in a concentration of between 16 and 64 mM.

Another preferred family of compositions comprises those whose molar ratio between copper ions and ethylenediamine lies between 1.96 and 2.00.

Although there is no restriction in principle on the nature of the solvent (provided that it dissolves the active species of the solution sufficiently and does not interfere with the electrodeposition), it will preferably be water.

In general, the electrodeposition composition according to the invention comprises a source of copper ions, in particular cupric ions $Cu^{2+}$.

Advantageously, the source of copper ions is a copper salt such as in particular copper sulfate, copper chloride, copper nitrate, copper acetate, preferably copper sulfate, and more preferably copper sulfate pentahydrate.

According to a particular characteristic, the copper ions are present within the electrodeposition composition in a concentration of between 14 and 120 mM; preferably between 16 and 64 mM.

Excellent results have been obtained with compositions in which the source of copper ions is present in a concentration of between 16 and 32 mM.

In the electrodeposition composition according to the invention, the molar ratio between copper ions and ethylenediamine is between 1.80 and 2.03, preferably between 1.96 and 2.00.

In general, the electrodeposition composition according to the invention has a pH of between 6.6 and 7.5. This value is normally reached when the electrodeposition composition according to the invention consists only of copper ions and ethylenediamine in the proportions mentioned above.

The pH of the composition may optionally be adjusted in the aforementioned pH range by means of a buffer such as one of those described in: "Handbook of Chemistry and Physics—84th edition" David R. Lide, CRC Press, in the event that the electrodeposition composition according to the invention includes compounds other than the source of copper ions and the ethylenediamine.

A currently preferred electrodeposition composition according to the invention comprises, in aqueous solution:
  copper ions in a concentration of between 16 and 64 mM;
  ethylenediamine;
  the molar ratio between ethylenediamine and copper being between 1.96 and 2.00;
  the pH of the said composition being between 6.6 and 7.5.

The electrodeposition compositions according to the invention may be employed in a customary electrodeposition method involving the surface of a substrate, such as in particular a barrier layer against copper diffusion of a structure of the "through via" type, being brought in contact with an electrodeposition composition according to the invention and a step of forming a coating on the said surface of the substrate, during which the said surface is polarized for a sufficient time to form the said coating.

Surprisingly, it has been observed that excellent results can in this case be obtained with the aid of an electrodeposition composition according to the invention by controlling, during the electrodeposition method, the conditions under which the surface to be coated is brought in contact with the said electrodeposition composition prior to the formation of the coating.

Quite unexpectedly, it has been observed that it is possible to obtain very good adhesion between the copper coating layer produced by electrodeposition and the barrier layer by bringing the surface to be coated in contact with the electrodeposition composition according to the invention without electrical polarization, that is to say without imposing an electrical current or electrical potential with respect to a back electrode or with respect to a reference electrode for this surface, prior to the electrodeposition step.

An improvement in this adhesion has been observed when the surface of the substrate to be coated is kept in contact with the electrodeposition composition (for example by immersion in the electrodeposition composition) for a time of at least 1 minute, for example of the order of 3 minutes, again prior to the electrodeposition step.

However, this improvement in adhesion is not observed unless the substrate provided with the barrier layer is coated with copper a short time after formation of this barrier layer. Thus, a decrease in adhesion by about 50% has been observed between a substrate covered with copper by electrodeposition less than one day after formation of the barrier layer and the same substrate coated with copper by electrodeposition several days after formation of the barrier layer.

In the scope of the present invention, a substrate coated with a barrier layer will be described as a substrate having experienced ageing if the coating by an electrodeposition composition according to the invention is carried out several days after formation of the barrier layer.

In this context, it has been observed that it is nevertheless possible to obtain very good adhesion between the copper coating layer produced by electrodeposition and the barrier layer, whether or not it has experienced ageing, by subjecting the said barrier layer to an electrochemical treatment of the "anodic polarization" type when it is in contact with the electrodeposition composition according to the invention, prior to the electrodeposition step.

Quite surprisingly and unexpectedly, it has been observed that this treatment by anodic polarization makes it possible not only to fully correct the adhesion loss due to ageing of the barrier layer, but also to obtain adhesion better than that obtained by bringing the surface to be coated in contact with the electrodeposition composition according to the invention without electrical polarization, whether or not this surface has experienced ageing. This treatment also makes it possible to avoid any loss of adhesion between the copper coating layer produced by an electrodeposition and the barrier layer when the latter experiences ageing.

In general, the "anodic polarization" step may be carried out with a current density of at least +0.3 mA·cm$^2$, for example of the order of +0.9 mA·cm$^2$, for a time of at least 2 s, for example of the order of 30 s.

It has been found that the improvement in the adhesion of the seed layer on the barrier layer also makes it possible to improve the adhesion of the "seed layer/filling layer or thick copper or thick layer" combination, that is to say the "operational" adhesion of the assembly for which the seed layer is produced.

This adhesion may for example be evaluated by "peeling" an adhesive tape bonded on the upper surface of the assembly, for example by using a test or traction machine. The adhesion thus measured, or interfacial energy expressed as J/m$^2$, characterizes overall both the adhesion of the seed layer on the barrier layer and the adhesion of the thick copper layer on the seed layer.

There is in principle no restriction on the step of removing the substrate coated with the copper seed layer after the formation of the coating.

It has been observed that it is possible, for example, to obtain a seed layer having a conductivity compatible with the traditional methods of filling by electrodeposition if the coated surface is kept under electrical polarization preferably for a time of between 1 and 10 seconds, preferably for a time of between 1 and 5 seconds after it is removed from the electrodeposition composition.

Thus, according to a first embodiment, the electrodeposition compositions according to the invention will be employed in an electrodeposition method comprising:
    a so-called "cold entry" step, during which the said surface to be coated is brought in contact with an electrodeposition bath without electrical polarization, and preferably kept in this state for a time of at least 1 minute;
    a step of forming the coating, during which the said surface is polarized for a sufficient time to form the said coating;
    a so-called "hot exit" step, during which the said surface is removed from the electrodeposition bath while it is still under electrical polarization.

According to a second embodiment, the electrodeposition compositions according to the invention will be employed in an electrodeposition method comprising:
    a step during which the said surface to be coated is brought in contact and kept in an electrodeposition bath without electrical polarization for a very short time of less than 5 s, preferably less than 3 s;
    an "anodic polarization" step, during which the said surface is polarized with a current density of between +0.3 mA/cm$^2$ and +4 mA/cm$^2$, preferably between +0.6 mA/cm$^2$ and +1.5 mA/cm$^2$, for a time of between 2 s and 3 min, preferably between 20 s and 1 min;
    a step during which the said surface is kept in the electrodeposition bath without electrical polarization, for a time of between 0 s and 5 min, preferably between 10 s and 1 min;
    a step of forming the coating, during which the said surface is polarized for a sufficient time to form the said coating;
    a so-called "hot exit" step, during which the said surface is removed from the electrodeposition bath while it is still under electrical polarization.

This second embodiment is particularly useful in the event that the substrate coated with the barrier layer has experienced significant ageing in the time prior to the deposition of the copper seed layer.

In this method, the step of forming the coating by electrodeposition is carried out for a sufficient time to form the desired coating. This time may be determined easily by the person skilled in the art, the growth of the film being a function of the charge which is equal to the time integral of the electrical current passed through the circuit during the deposition time (Faraday's law).

In general, the electrodeposition step will be carried out at room temperature.

During the step of forming the coating, the surface to be coated may be polarized cathodically, either in galvanostatic mode (fixed imposed current) or in potentiostatic mode (imposed and fixed potential, optionally with respect to a reference electrode), or alternatively in pulsed (current or voltage) mode.

In general, it has been observed that a particularly satisfactory coating can be obtained by polarization in pulsed mode, preferably so as to impose square current waves.

In general, this step may be carried out by imposing square current waves corresponding to a maximum current per unit area in a range of from −0.6 mA/cm² to −10 mA/cm², more particularly from −1 mA/cm² to −5 mA/cm², and a minimum current per unit area in a range of from 0 mA/cm² to −5 mA/cm², preferably 0 mA/cm².

More particularly, the polarization time at maximum current may be between 2·10⁻³ and 1.6 seconds, preferably between 0.1 and 0.8 second, for example of the order of 0.35 second, while the polarization time at minimum current may be between 2·10⁻³ and 1.6 seconds, preferably between 0.1 and 0.8 second, for example of the order of 0.25 second.

The number of cycles to be carried out during the step depends on the desired thickness of the coating.

In general, the person skilled in the art will easily determine the number of cycles to be carried out, given that under the preferential conditions mentioned above and illustrated in the exemplary embodiments it has been observed that the deposition rate is about 0.3 nm per second.

This embodiment of the invention has made it possible to produce copper seed layers having a thickness of between 50 nm and 1 µm on highly resistive substrates of structures of the "through via" type, the "sheet resistance" of which may be as much as 1000 ohms/square, or even several megaohms/square.

According to a second aspect, the present invention relates to the use of the electrodeposition compositions described above for coating a barrier layer against copper diffusion of a structure of the "through via" type, in the fabrication of interconnects for integrated circuits.

Under this aspect, the present invention also includes a method for coating a surface of a substrate, such as in particular the surface of a barrier layer against copper diffusion of a structure of the "through via" type, which comprises bringing the said surface in contact with an electrodeposition composition as described above and a step during which the said surface is polarized for a sufficient time to form the said coating According to a particular characteristic, the barrier layer against copper diffusion comprises at least one of the materials selected from tantalum (Ta), titanium (Ti), tantalum nitride (TaN), titanium nitride (TiN), tungsten (W), tungsten titanate (TiW) and tungsten nitride or carbide (WCN).

This coating method is particularly useful for the production of a copper seed layer having a thickness which may be of the order of 50 nm to 5 µm, preferably from 100 nm to 3 µm, for example of the order of 300 nm, on the surface of a barrier against copper diffusion as defined above in a structure of the "through via" type.

The present invention will now be illustrated by the following nonlimiting examples, in which the compositions according to the invention are used to deposit a copper seed layer on through vias coated with a barrier layer against copper diffusion. These examples may be employed particularly in the fabrication of copper interconnect structures for integrated circuits.

EXAMPLE 1

Preparation of a Copper Seed Layer on a Tantalum-Based Barrier Layer with the Aid of a Composition According to the Invention Based on a Mixture of Copper and Ethylenediamine A. Material and Equipment
Substrate:
The substrate used in this example consists of a silicon wafer with a diameter of 200 mm and a thickness of 750 µm, etched with cylindrical patterns of the "through via" type with depth 25 µm and diameter 5 µm.

These patterns are covered with a silicon dioxide layer having a thickness of 400 nm, itself coated with a tantalum-based layer which is deposited by PVD (physical vapour deposition) and is divided into three sub-layers: tantalum (80 nm), tantalum nitride (15 nm) and tantalum again (10 nm).

This Ta/TaN/Ta "trilayer" constitutes a barrier against copper diffusion such as used in so-called "through via" structures in the fabrication of integrated circuits.

In this example, the substrate covered with the barrier layer against copper diffusion is used very soon (for example less than 1 day) after the formation of the barrier layer.

Electrodeposition Solution:
The electrodeposition solution employed in this example is an aqueous solution containing 2.1 ml/l (or 32 mM) of ethylenediamine and 4 g/l (or 16 mM) of $CuSO_4(H_2O)_5$.

The characteristics of the solution are given in Table 1.

Equipment:
This example used electrolytic deposition equipment representative of those employed in the microelectronics industry, of the Semitool® brand and the Equinox™ type, capable of treating wafers with a diameter of 200 mm.

This equipment has an electrochemical deposition cell, in which deposition of the seed layer is carrier out, and a rinsing/drying station used after deposition.

The electrolytic deposition cell has an anode, which may consist either of an inert metal (for example titanium covered with platinum, for example) or a metal identical to that constituting the seed layer, in this case copper; the silicon wafer coated with the Ta/TaN/Ta barrier layer constitutes the cathode of this cell.

This cell furthermore has a stabilized electrical power supply making it possible to deliver up to 120 V and 15 A and a device, physically isolated from the solution by a sealing gasket, for making electrical contact with the cathode. This electrical contacting device is generally of an annular shape and allows the substrate to be supplied at a plurality of contact points arranged regularly on it.

It also has a device for supporting the wafer to be coated, having means for setting the said wafer in rotation at a predetermined speed.

B. Experimental Protocol
A chemical treatment may be carried out in certain cases before starting the electrodeposition method. The purpose of this treatment is to increase the wettability for the electrodeposition solution in the vias and to expel the air bubbles. It may consist, for example, in immersing the wafer in an acidic or neutral solution and in placing the whole arrangement in an ultrasound tank for a time of at least 5 minutes (for example 10 minutes). This chemical treatment may vary according to the nature of the barrier layer and the dimension of the through vias.

The electrodeposition method employed in this example includes the following different consecutive steps.

Step 1: "Cold Entry"
This step may be divided into two sub-steps:
1.1. The aforementioned substrate is introduced into the electrolytic deposition cell so that the face having the Ta/TaN/Ta barrier layer comes in contact with the electrical contacting device, the latter not yet being electrically supplied.
1.2. The assembly formed by the electrical contacting device and the substrate, which will be referred to below as the "cathodic assembly" is brought in contact with the electrodeposition solution, for example by immersion. This contact, the duration of which is generally less than or equal to 5 seconds (for example 2 seconds) takes place while the device is not yet electrically supplied. Preferably, the cathodic assembly is then kept in the electrodeposition solution without polarization for a time of at least 1 minute (for example of the order of 3 minutes).

Step 2: Formation of the Copper Coating

The cathodic assembly is then polarized in galvano-pulsed mode and simultaneously rotated at a speed of From 20 to 100 revolutions per minute (for example 40 revolutions per minute).

FIG. 1 describes in detail the galvano-pulsed protocol which may be used, with a total period P of between 10 ms and 2 s (0.6 s in the example), a polarization time $T_{ON}$ of between 2 ms and 1.6 s (0.35 s in the example), while imposing a current per unit area generally lying between $-0.6$ mA/cm$^2$ and $-10$ mA/cm$^2$ ($-2.77$ mA/cm$^2$ in the example), and a resting time without polarization of between 2 ms and 1.6 s (0.25 s in the example).

As will be understood, the duration of this step depends on the desired thickness of the seed layer. This time may be determined easily by the person skilled in the art, the growth of the film being a function of the charge passed through the circuit.

Under the aforementioned conditions, the deposition rate is about 1.5 nm per coulomb of charge passed through the circuit, which gives an electrodeposition step duration of the order of 17 minutes in order to obtain a coating having a thickness of 300 nm.

Step 3: "Hot Exit"

This step may be divided into two sub-steps:

3.1. After the electrodeposition step, the cathodic assembly coated with copper is removed from the electrodeposition solution with a zero rotation speed while being kept under voltage polarization. The duration of this phase is about 2 seconds.

The rotation speed is then increased to 500 revolutions per minute for 10 seconds, the polarization of the cathodic assembly being disconnected during this last phase.

Pre-rinsing with deionized water is carried out in the cell.

3.2. The substrate coated with the seed layer is then transferred into the rinsing/drying module in order to undergo rinsing with deionized water.

The rinsing water is subsequently discharged, then drying is carried out while flushing with nitrogen.

The rotation is then stopped in order to allow the coated and dried substrate to be removed.

In this example, the exit step, and in particular the removal of the cathodic assembly from the electrodeposition solution, was carried out under voltage polarization at the same level as during the step of forming the deposit.

C. Results Obtained

By applying the experimental protocol explained above, a copper layer with a thickness of 300 nm was obtained.

The measurements and characterizations carried out on this layer (300 nm) are presented in Examples 18 to 20.

EXAMPLE 2

Preparation of a Copper Seed Layer on a Tantalum-Based Barrier Layer with the Aid of a Composition According to the Invention Based on a Mixture of Copper and Ethylenediamine By applying the experimental protocol explained in Example 1, a copper seed layer with a thickness of 300 nm was prepared with the aid of the electrodeposition solutions according to the invention, the characteristics of which are given in Table 1.

The measurements and characterizations carried out on this layer (300 nm) are presented in Examples 18 to 20.

EXAMPLE 3

Preparation of a Copper Seed Layer on a Tantalum-Based Barrier Layer with the Aid of a Composition According to the Invention Based on a Mixture of Copper and Ethylenediamine A. Material and Equipment Substrate:

The substrate used in this example is identical to the substrate used in Example 1.

Electrodeposition Solution:

The electrodeposition solution employed in this example is an aqueous solution containing 8.4 ml/l (or 128 mM) of ethylenediamine and 16 g/l (or 64 mM) of CuSO$_4$ (H$_2$O)$_5$, having a pH of 7.2.

Equipment:

The equipment used in this exam pie is identical to that of Example 1.

B. Experimental Protocol

Four series of experiments were used.

B.1. Cold Entry without Ageing of the Barrier Layer

The experimental protocol used here is strictly identical to that of Example 1, the formation of the copper seed layer being carried out soon (less than 1 day) after formation of the barrier layer.

B.2. Cold Entry after Ageing of the Barrier Layer

The experimental protocol used here is identical to that of Example 1, except that the formation of the copper seed layer is carried out several days after the formation of the barrier layer.

B.3. Anodic Polarization after Ageing of the Barrier Layer

A substrate coated with a barrier layer was used here which had experienced the same ageing as the substrate used in protocol B.2. above.

The electrodeposition method employed for the formation of the copper seed layer involves contacting the layer to be coated under anodic polarization. This electrodeposition method includes the following different consecutive steps.

Step 1: Entry Under Anodic Polarization

Figure 2:
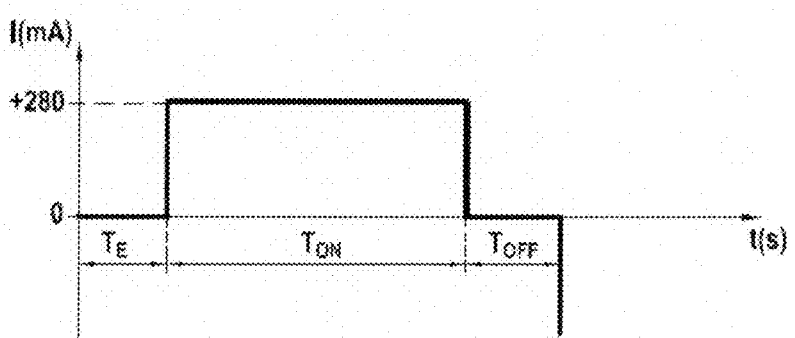
FIG. 2 illustrates the protocol of entry under anodic polarisation used in an electro-deposition method according to the invention.

FIG. 2 illustrates the protocol of entry under anodic polarization which may be used; this protocol may be divided into three sub-steps:

1.1. The aforementioned substrate is introduced into the electrolytic deposition cell so that the face having the tantalum-based barrier layer comes in contact with the electrical contacting device, the latter not yet being electrically supplied.

1.2. The assembly formed by the electrical contacting device and the substrate, which will be referred to below as the "cathodic assembly" is brought in contact with the electrodeposition solution, for example by immersion. This contact, the duration of which is generally less than or equal to 5 seconds (for example 2 seconds) takes place while the device is not yet electrically supplied. Preferably, the cathodic assembly is then kept in the electrodeposition solution without polarization for a time $T_E$ less than or equal to 5 seconds (for example 3 seconds).

1.3. The cathodic assembly is then polarized anodically by imposing a current per unit area generally lying between $+0.3$ mA/cm$^2$ and $+4$ mA/cm$^2$ ($+0.9$ mA/cm$^2$ in the example), for a time $T_{ON}$ of between 2 seconds and 3 minutes (30 s in the example).

1.4. The anodic polarization is then disconnected, the cathodic assembly still being kept in the electrodeposition solution for a time $T_{OFF}$ of between 0 second and 5 minutes (1 minute in the example).

Step 2: Formation of the Copper Coating

This step is identical to the corresponding step of Example 1.

Step 3: "Hot Exit"

This step is identical to the corresponding step of Example 1.

B.4. Anodic Polarization without Ageing of the Barrier Layer

The experimental protocol which was used is strictly identical to the protocol B.3. described above, except that it was applied to the same substrate without the latter having experienced any ageing.

C. Results Obtained

By applying the experimental protocol explained above, a copper layer with a thickness of 300 nm was obtained.

The measurements and characterizations carried out after deposition of the seed layer (300 nm) are presented in Examples 18 to 20.

EXAMPLE 4

Preparation of a Copper Seed Layer on Structures of the "Through Via" Type Covered with a Barrier Layer of Titanium Nitride with the Aid of a Composition According to the Invention Based on a Mixture of Copper and Ethylenediamine A. Material and Equipment Substrate:

The substrate used in this example consists of a silicon wafer with a diameter of 200 mm and a thickness of 750 µm, etched with cylindrical patterns of the "through via" type with depth 50 µm and diameter 5 µm.

These patterns are covered with a silicon dioxide layer having a thickness of 400 nm, itself coated with a layer of titanium nitride TiN deposited by CVD (chemical vapour deposition).

The titanium nitride constitutes a barrier against copper diffusion such as used in so-called "through via" structures in the fabrication of integrated circuits.

Electrodeposition Solution:

The electrodeposition solution employed in this example is identical to that of Example 3.

Equipment:

The equipment employed in this example is identical to that of Example 1.

B. Experimental Protocol

Four series of experiments were carried out by following the protocols B.1., B.2., B.3. and B.4. described in Example 3.

In each case, a copper layer with a thickness of 300 nm was obtained.

C. Results Obtained

The measurements and characterizations carried out on this layer are presented in Examples 18 to 20.

EXAMPLE 5

Preparation of a Copper Seed Layer on a Barrier Layer of Titanium Nitride with the Aid of a Composition According to the Invention Based on a Mixture of Copper and Ethylenediamine A. Material and Equipment Substrate:

The substrate used in this example consists of a silicon wafer with a diameter of 200 mm and a thickness of 750 µm, etched with cylindrical patterns of the "through via" type with depth 200 µm and diameter 75 µm.

These patterns are covered with a silicon dioxide layer having a thickness of 400 nm, itself coated with a 50 nm layer of titanium nitride deposited by ALD (atomic layer deposition).

The titanium nitride constitutes a barrier against copper diffusion such as used in so-called "through via" structures in the fabrication of integrated circuits.

Electrodeposition Solution:

The solution used in this example is identical to that of Example 1.

Equipment:

The equipment used in this exam pie is identical to that of Example 1.

B. Experimental Protocol

The experimental protocol used in this example is identical to that of Example 1.

C. Results Obtained

By applying the experimental protocol explained above, a copper layer with a thickness of 300 nm was obtained.

The measurements and characterizations carried out after deposition of the seed layer (300 nm) are presented in Examples 18 to 20.

EXAMPLE 6

Preparation of a Copper Seed Layer on a Barrier Layer of Titanium Nitride with the Aid of a Composition According to the Invention Based on a Mixture of Copper and Ethylenediamine A. Material and Equipment Substrate:

The substrate used in this example consists of a silicon wafer with a diameter of 200 mm and a thickness of 750 µm, etched with cylindrical patterns of the "through via" type with depth 50 µm and diameter 5 µm.

These patterns are covered with a silicon dioxide layer having a thickness of 400 nm, itself coated with a 40 nm layer of titanium nitride deposited by CVD (chemical vapour deposition).

The titanium nitride constitutes a barrier against copper diffusion such as used in so-called "through via" structures in the fabrication of integrated circuits.

Electrodeposition Solution:

The solution used in this example is identical to that of Example 1.

Equipment:

The equipment used in this exam pie is identical to that of Example 1.

B. Experimental Protocol

The experimental protocol used in this example is identical to that of Example 1.

C. Results Obtained

By applying the experimental protocol explained above, a copper layer with a thickness of 300 nm was obtained.

The measurements and characterizations carried out after deposition of the seed layer (300 nm) are presented in Examples 18 to 20.

EXAMPLE 7

Preparation of a Copper Seed Layer on Structures of the "Through Via" Type Covered with a Barrier Layer of Titanium Nitride with the Aid of a Composition According to the Invention Based on a Mixture of Copper and Ethylenediamine A. Material and Equipment Substrate:

The substrate used in this example is identical to the substrate used in Example 1.

Electrodeposition Solution:

The electrodeposition solution used in this example is identical to that of Example 3.

Equipment:

The equipment used in this example is identical to that of Example 1.

B. Experimental Protocol

In this example, a so-called "reverse pulse" protocol is used in order to produce the copper seed coating. The formation of the copper seed layer is carried out several days after the formation of the barrier layer.

The electrodeposition method employed in this example includes the following different consecutive steps.

Step 1: Entry Under Anodic Polarization

The experimental protocol used is identical to the protocol B.3. described in Example 3.

Step 2: Formation of the Copper Coating

The cathodic assembly is then polarized in "reverse pulse" mode and simultaneously rotated at a speed of from 20 to 100 revolutions per minute (40 revolutions per minute in the example).

Figure 3:
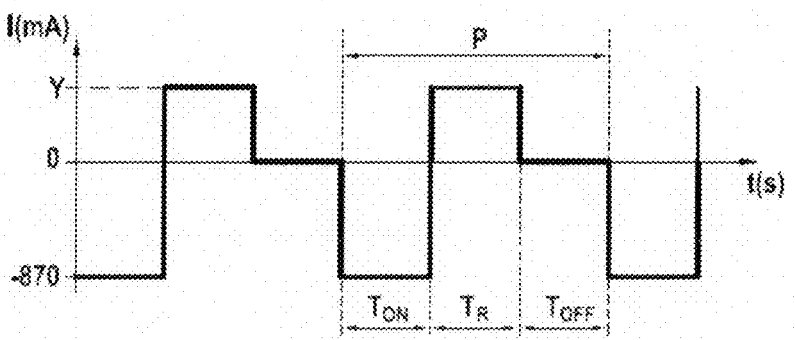
FIG. 3 illustrates the so-called "reverse pulse" protocol used for the formation of the copper coating in an electro-deposition method according to the invention.

FIG. 3 illustrates the so-called "reverse pulse" protocol which may be used, with a total period P of between 10 ms and 3 s (0.9 s in the example), a cathodic polarization time $T_{ON}$ of between 2 ms and 1.6 s (0.35 s in the example) while imposing a current per unit area generally lying between $-0.6$ mA/cm$^2$ and $-10$ mA/cm$^2$ ($-2.77$ mA/cm$^2$ in the example), an anodic polarization time $T_R$ of between 2 ms and 1.6 s (0.25 s in the example) while imposing a current per unit area generally lying between $+0.2$ mA/cm$^2$ and $+5$ mA/cm$^2$ ($+1.11$ mA/cm$^2$ in the example) and an optional resting time without polarization $T_{OFF}$ of between 0 s and 1 s (0.3 s in the example).

As will be understood, the duration of this step depends on the desired thickness of the seed layer. This time may be determined easily by the person skilled in the art, the growth of the film being a function of the charge passed through the circuit.

Step 3: "Hot Exit"

This step is identical to the corresponding step of Example 1.

The same experimental protocol was applied to the same substrate, which had not experienced any ageing.

C. Results Obtained

By applying the experimental protocol explained above, a copper layer with a thickness of 300 nm was obtained.

The measurements and characterizations carried out after deposition of the seed layer (300 nm) are presented in Examples 18 to 20.

EXAMPLE 8

Preparation of a Copper Seed Layer on Structures of the "Through Via" Type Covered with a Barrier Layer of Titanium with the Aid of a Composition According to the Invention Based on a Mixture of Copper and Ethylenediamine A. Material and Equipment Substrate:

The substrate used in this example consists of a silicon wafer with a diameter of 200 mm and a thickness of 750 µm, etched with cylindrical patterns of the "through via" type with depth 60 µm and diameter 30 µm.

These patterns are covered with a silicon dioxide layer having a thickness of 400 nm, itself coated with a 0.3 µm layer of titanium Ti deposited by PVD (physical vapour deposition).

The titanium constitutes a barrier against copper diffusion such as used in so-called "through via" structures in the fabrication of integrated circuits.

Electrodeposition Solution:

The electrodeposition solution employed in this example is identical to that of Example 3.

Equipment:

The equipment used in this exam pie is identical to that of Example 1.

B. Experimental Protocol

Four series of experiments were carried out by following the protocols B.1., B.2., B.3. and B.4. described in Example 3.

In each case, a copper layer with a thickness of 300 nm was obtained.

C. Results Obtained

The measurements and characterizations carried out on this layer are presented in Examples 18 to 20.

EXAMPLE 9

Preparation of a Copper Seed Layer on a Barrier Layer of Titanium with the Aid of a Composition According to the Invention Based on a Mixture of Copper and Ethylenediamine A. Material and Equipment Substrate:

The substrate used in this example consists of a silicon wafer with a diameter of 200 mm and a thickness of 750 µm, etched with cylindrical patterns of the "through via" type with depth 60 µm and diameter 30 µm.

These patterns are covered with a silicon dioxide layer having a thickness of 400 nm, itself coated with a 0.3 µm layer of titanium deposited by PVD (physical vapour deposition).

The titanium constitutes a barrier against copper diffusion such as used in so-called "through via" structures in the fabrication of integrated circuits.

Electrodeposition Solution:

The solution used in this example is identical to that of Example 1.

Equipment:

The equipment used in this example is identical to that of Example 1.

B. Experimental Protocol

The experimental protocol used in this example is identical to that of Example 1.

C. Results Obtained

By applying the experimental protocol explained above, a copper layer with a thickness of 300 nm was obtained.

The measurements and characterizations carried out after deposition of the seed layer (300 nm) are presented in Examples 18 to 20.

COMPARATIVE EXAMPLES 10 to 17

Preparation of a Copper Seed Layer on a Tantalum-Based Barrier Layer with the Aid of a Composition According to the Invention Based on a Mixture of Copper and Ethylenediamine By applying the experimental protocol explained in Example 1, a copper seed layer with a thickness of 300 nm was prepared with the aid of reference electrodeposition solutions, the characteristics of which are given in Table 1.

The measurements and characterizations carried out on this layer (300 nm) are presented in Examples 18 to 20.

TABLE 1

The characteristics of the solution prepared in Examples 1 to 17 above are collated in the following table.

| Electrodeposition solution prepared according to | Copper (mM) | Ethylenediamine (mM) | pH |
| --- | --- | --- | --- |
| Example 1 | 16 | 32 | 7.2 |
| Example 2 | 40 | 80 | 7.2 |
| Example 3 | 64 | 128 | 7.2 |
| Example 4 | 64 | 128 | 7.2 |
| Example 5 | 16 | 32 | 7.2 |
| Example 6 | 16 | 32 | 7.2 |
| Example 7 | 64 | 128 | 7.2 |
| Example 8 | 64 | 128 | 7.2 |
| Example 9 | 16 | 32 | 7.2 |
| Comparative Example 10 | 128 | 256 | 7.2 |
| Comparative Example 11 | 12 | 24 | 7.2 |
| Comparative Example 12 | 8 | 16 | 7.2 |
| Comparative Example 13 | 4 | 8 | 7.2 |
| Comparative Example 14 | 16 | 23.8 | 6.3 |
| Comparative Example 15 | 16 | 35.2 | 10.6 |
| Comparative Example 16 | 16 | 40 | 11 |
| Comparative Example 17 | 16 | 46.2 | 11.1 |

EXAMPLE 18

Characterization of the Resistivity of the Seed Layer Obtained in Structures of the "Through Via" Type with the Aid of Compositions According to the Invention and Reference Compositions Based on a Mixture of Copper and Ethylenediamine A. Material and equipment The "sheet resistance" was measured with the aid of a measuring apparatus of the "4 point" type ("four point probe") which is well known to the person skilled in the art for measuring the electrical resistance of thin layers. It is expressed in ohms/square, and it is equivalent to the resistivity for abidimensional system i.e. one in which the current flows in the plane of the layer rather than in a plane perpendicular to this layer. Mathematically, the value of the sheet resistance is obtained by dividing the resistivity of the material (expressed in ohm·m or micro-ohm·cm) constituting the layer by the thickness of this layer (expressed in m or nm).

B. Measurement Method

The sheet resistance multiplied by the thickness of the seed layer gives the resistivity of copper.

C. Results Obtained

The copper resistivities obtained in Examples 1 to 14 above are of the order of 2 μohm·cm for a 200 nm seed layer and 1.8 μohm·cm for a seed layer of 400 nm or more.

These resistivity levels are entirely compatible with use on the industrial scale.

EXAMPLE 19

Characterization of the Coverage of the Seed Layer Obtained in Structures of the "Through Via" Type with the Aid of Compositions According to the Invention and Reference Compositions Based on a Mixture of Copper and Ethylenediamine A. Material and Equipment The coverage and conformity of the copper seed layer were evaluated on the basis of observations in section with a scanning electron microscope, while focusing on the bottom of the structures which constitutes the most difficult zone to cover.

B. Measurement Method

The percentage coverage is measured in the bottom zone of the structures, between the base of the bias and 4 μm above. A percentage of 100% corresponds to complete coverage, i.e. the surface of the barrier is entirely covered with copper in the bottom zone. A surface partially covered with copper is characterized by the fraction of the surface covered with copper, expressed as a percentage.

When the coverage is complete, the percentage conformity is calculated by dividing the thickness of the seed layer on the vertical surfaces (profile or side) of the via by that on the horizontal surfaces at the top of the via. The thickness on the vertical surfaces is measured at a given depth of the via (4 μm above the bottom of the via). A percentage of 100% corresponds to perfect conformity.

C. Results Obtained

Table 2 below collect the results obtained on the copper seed layers prepared with the aid of the compositions of Examples 1 to 17 above.

Figure 4:
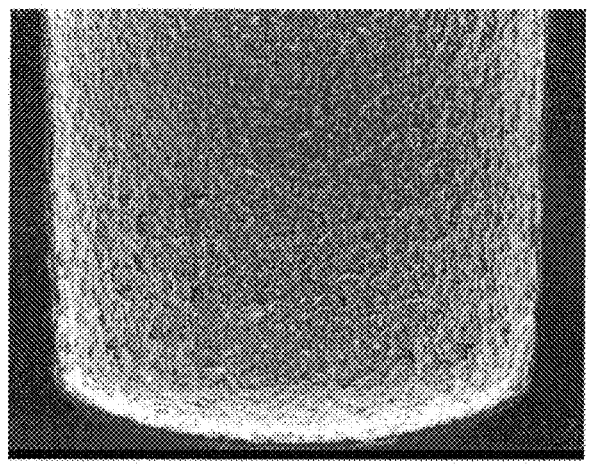
FIG. 4 shows the scanning electron microscope observation (magnification 20K) of the copper seed layer prepared according to example 1.
Figure 5:
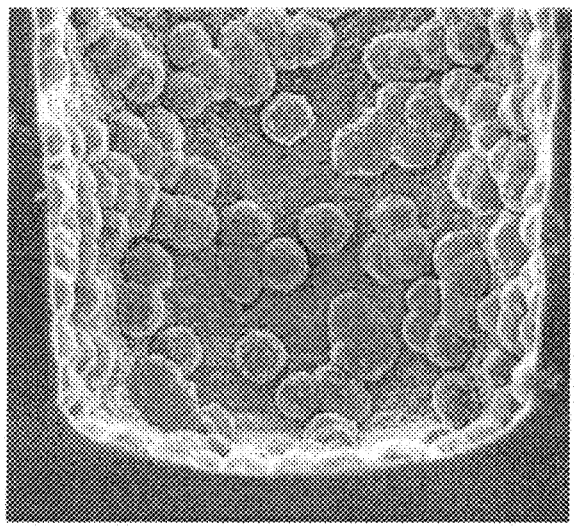
FIG. 5 shows the scanning electron microscope observation (magnification 20K) of the copper seed layer prepared according to comparative example 11.

The scanning electron microscope observations (magnification 20 K) are shown in FIG. 4 in the case of Example 1 (100% coverage) and in FIG. 5 in the case of Comparative Example 11 (55% coverage).

TABLE 2

Conformity and coverage of the copper seed layers obtained according to Examples 1 to 17.

| Copper seed layer obtained according to | Coverage (%) | Conformity (%) |
| --- | --- | --- |
| Example 1 | 100 | 80-100 |
| Example 2 | 100 | 70-90 |
| Example 3 (protocol B1) | 100 | 70-90 |
| Example 3 (protocol B3) | 100 | 80-100 |
| Example 4 (protocol B3) | 100 | 40-60 |
| Example 5 | 100 | 30-40 |
| Example 6 | 100 | 30-50 |
| Example 7 | 100 | 80-100 |
| Example 8 (protocol B3) | 100 | 50-70 |
| Example 9 | 100 | 40-60 |
| Comparative Example 10 | 45 | — |
| Comparative Example 11 | 90 | — |
| Comparative Example 12 | 85 | — |
| Comparative Example 13 | 60 | — |
| Comparative Example 14 | 95 | — |
| Comparative Example 15 | 90 | — |
| Comparative Example 16 | 75 | — |
| Comparative Example 17 | 55 | — |

The results given in Table 2 above show the critical nature of the electrodeposition composition according to the invention.

All the electrodeposition compositions according to the present invention (Examples 1 to 9) lead to a 100% coverage factor of the substrate and a conformity of at least 30%, which is satisfactory on the industrial scale. The composition of Example 1 leads to an excellent conformity factor which may reach 100%.

Reference compositions (Examples 10 to 17) that are relatively similar (in qualitative and quantitative terms) to the claimed compositions lead to coverage factors of less than 95%, which makes them unusable in practice on the industrial scale.

EXAMPLE 20

Characterization of the Adhesion of the Seed Layer Obtained in Structures of the "Through Via" Type with the Aid of Compositions According to the Invention and Reference Compositions Based on a Mixture of Copper and Ethylenediamine A. Material and Equipment The adhesion or interfacial energy was measured with the aid of a device (so-called test or traction machine) which exerts an increasing vertical tensile force on the surface by means of a powerful adhesive tape, until the copper layer is separated from the substrate.

B. Measurement Method

The work of the force (force multiplied by length of the layer which has been stripped), measured using the equipment described above, is equivalent to the energy which it would have been necessary to supply in order to separate the copper layer from its substrate. By dividing this energy by the value of the surface area which has been stripped, the energy per unit area is obtained.

C. Results Obtained

Table 3 below collates the results obtained in Examples 1 to 17 above.

TABLE 3

Adhesion of the copper seed layers obtained according to Examples 1 to 17.

| Copper seed layer obtained according to | Cold entry | | Anodic polarization | |
|---|---|---|---|---|
| | without ageing | after ageing | after ageing | without ageing |
| Example 1 | 8 | | | |
| Example 2 | 5 | | | |
| Example 3 | 5 | 1.5 | 9 | 9 |
| Example 4 | 6 | 2.5 | 10 | 10 |
| Example 5 | 7 | | | |
| Example 6 | 10 | | | |
| Example 7 | | | 11 | 11 |
| Example 8 | 5 | 2.5 | 11 | 11 |
| Example 9 | 8 | | | |
| Comparative Ex. 10 | 3 | | | |
| Comparative Ex. 11 | 8 | | | |
| Comparative Ex. 12 | 7 | | | |
| Comparative Ex. 13 | 8 | | | |
| Comparative Ex. 14 | 7 | | | |
| Comparative Ex. 15 | 6 | | | |
| Comparative Ex. 16 | 5 | | | |
| Comparative Ex. 17 | 4 | | | |

The results given in Table 3 above show that the compositions according to the present invention lead to copper seed layers having good adhesion, which is compatible with industrial application.

This table also shows the advantage, from an industrial viewpoint, of the anodic polarization protocol which will advantageously be used in the event that the substrate provided with its barrier layer has experienced ageing over time.

The invention claimed is:

1. A method for coating a surface of a barrier layer against copper diffusion of a structure of through vias for production of interconnects in integrated circuits, the method comprising:
bringing the surface of the barrier layer of the through vias in contact with an electrodeposition composition that comprises, in a solution with a solvent:
copper ions in a concentration of between 14 and 120 mM; and
ethylenediamine,
the molar ratio between the ethylenediamine and the copper ions being between 1.80 and 2.03, and
the pH of the composition being between 6.6 and 7.5; and
polarizing the surface for a sufficient time to form a copper seed layer with a thickness of 100 nm to 3 microns.

2. The method according to claim 1, wherein the surface of the barrier layer forms a barrier against copper diffusion, and the surface of the barrier layer comprises at least one of the materials selected from tantalum (Ta), titanium (Ti), tantalum nitride (TaN), titanium nitride (TiN), tungsten (W), tungsten titanate (TiW) and tungsten nitride or carbide (WCN).

3. The method according to claim 2, wherein the surface forming the barrier against copper diffusion consists of a tantalum/tantalum nitride/tantalum trilayer or a tantalum nitride/tantalum bilayer or a titanium nitride layer.

4. The method according to claim 1, wherein the concentration of the copper ions is between 16 and 64 mM.

5. The method according to claim 4, wherein the copper ions are cupric ions.

6. The method according to claim 1, wherein the copper ions are cupric ions.

7. The method according to claim 1, wherein the copper ions are originating from copper sulfate.

8. The method according to claim 1, wherein the molar ratio between the ethylenediamine and the copper ions is between 1.96 and 2.00.

9. The method according to claim 1, wherein the formed copper seed layer exhibits a coverage factor of more than 99%.

* * * * *